United States Patent
Yen et al.

(10) Patent No.: US 9,935,196 B2
(45) Date of Patent: Apr. 3, 2018

(54) SEMICONDUCTOR DEVICE AND MULTIPLE GATE FIELD EFFECT TRANSISTOR

(71) Applicant: Realtek Semiconductor Corp., HsinChu (TW)

(72) Inventors: Hsiao-Tsung Yen, Hsinchu (TW); Yuh-Sheng Jean, Hsinchu (TW); Ta-Hsun Yeh, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 14/814,487

(22) Filed: Jul. 30, 2015

(65) Prior Publication Data
US 2016/0035887 A1    Feb. 4, 2016

(30) Foreign Application Priority Data
Jul. 31, 2014  (TW) .............................. 103126251 A

(51) Int. Cl.
*H01L 29/78*    (2006.01)
*H01L 29/66*    (2006.01)
*H01L 29/423*    (2006.01)

(52) U.S. Cl.
CPC ...... *H01L 29/7831* (2013.01); *H01L 29/4236* (2013.01); *H01L 29/66666* (2013.01); *H01L 29/66787* (2013.01); *H01L 29/785* (2013.01); *H01L 29/7827* (2013.01)

(58) Field of Classification Search
CPC .................... H01L 29/7831; H01L 29/4236
See application file for complete search history.

(56) References Cited

U.S. PATENT DOCUMENTS

| | | | | |
|---|---|---|---|---|
| 7,456,476 B2 * | 11/2008 | Hareland | .......... | H01L 29/42384 257/349 |
| 2007/0120182 A1 * | 5/2007 | Rouh | ................ | H01L 21/28061 257/330 |
| 2010/0200923 A1 * | 8/2010 | Chen | ................. | H01L 29/41791 257/365 |
| 2012/0112251 A1 * | 5/2012 | Forbes | ............. | H01L 21/82382 257/288 |
| 2013/0146992 A1 * | 6/2013 | Erickson | ................. | H01L 29/78 257/402 |
| 2015/0041889 A1 * | 2/2015 | Sun | ..................... | H01L 29/7813 257/331 |

FOREIGN PATENT DOCUMENTS

| | | |
|---|---|---|
| CN | 101290936 B | 3/2012 |
| TW | 201312659 A1 | 3/2013 |

* cited by examiner

*Primary Examiner* — William F Kraig
*Assistant Examiner* — Khatib Rahman
(74) *Attorney, Agent, or Firm* — Winston Hsu

(57) ABSTRACT

The present invention provides a semiconductor device, which includes a substrate, a first gate electrode, a second gate electrode, a source region and a drain region, wherein the first gate electrode and the second gate electrode are embedded in the substrate respectively; the source region is formed in the substrate, and at least a portion of the source region is disposed between the first gate electrode and the second gate electrode; and the drain region is formed in the substrate, and at least a portion of the drain region is disposed between the first gate electrode and the second gate electrode.

4 Claims, 5 Drawing Sheets

The side view

The top view

SEMICONDUCTOR DEVICE AND MULTIPLE GATE FIELD EFFECT TRANSISTOR

BACKGROUND OF THE INVENTION

1. Field of the Invention

The present invention relates to a semiconductor device, and more particularly, to a field effect transistor with multiple gates.

2. Description of the Prior Art

For pursuing higher density of device, better specification and lower manufacturing costs, such as fin-like field effect transistor, a three dimensions structure design, so called FinFET hereinafter, is used in advance semiconductor process to achieve these goals, however, field effect transistor (FET) based on this advance process can't support high voltage generally and price of masks is much higher, so it needs special device design like increasing area of transistor to support high voltage.

SUMMARY OF THE INVENTION

As the present invention is to provide a semiconductor device, which uses three dimensions design to manufacture FET and has advantages less area consuming and better performance.

According to an embodiment of present invention, which discloses a semiconductor device comprises a substrate, a first gate electrode, a second gate electrode, a source region and a drain region, wherein the first gate and second gate electrode are embedded in the substrate respectively; the source region is formed in the substrate, and at least a portion of the source region is disposed between the first gate electrode and the second gate electrode; and the drain region is formed in the substrate, and at least a portion of the drain region is disposed between the first gate electrode and the second gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
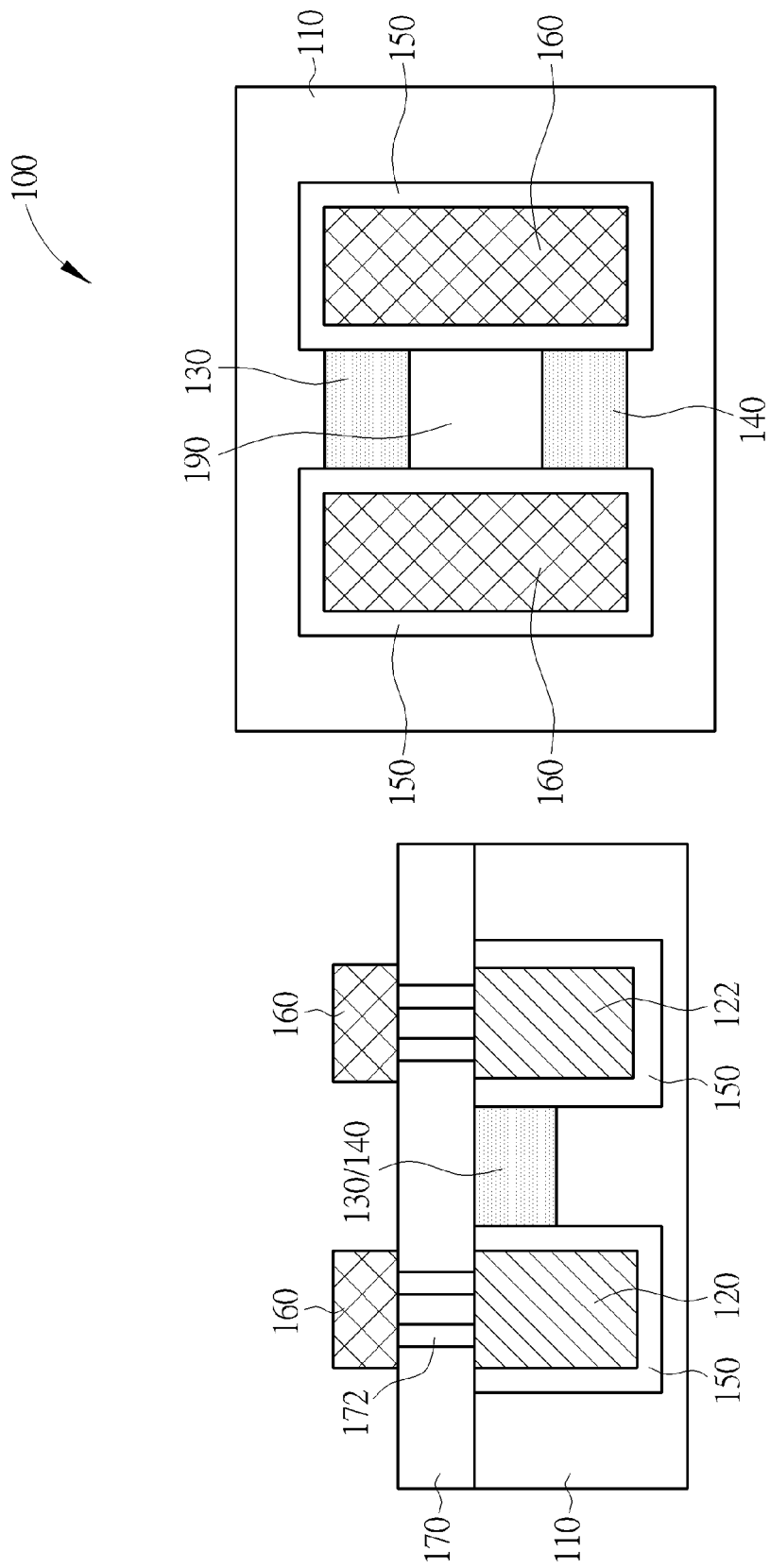
FIG. 1 is a diagram illustrating a side view and a top view of the semiconductor device according to a first embodiment of the present invention.

FIG. 1 is a diagram illustrating a side view and a top view of a semiconductor device 100 according to a first embodiment of the present invention, wherein the semiconductor device 100 is a multiple gate FET, which comprises a substrate 110, a first gate electrode 120, a second gate electrode 122, a source region 130 and a drain region 140, wherein the first and second gate electrode 120, 122 are surrounded by oxide film 150 and embedded in the substrate 110; the source region 130 and the drain region 140 are formed in the substrate 110, and disposed between the first gate electrode 120 and the second gate electrode 122. In addition, there are a dielectric layer 170 and a metal layer 160 above the substrate 110, wherein the metal layer 160 is electrically connected to the first and second gate electrode 120, 122 through via holes 172, and the first and second gate electrode 120, 122 receive a gate voltage through the metal layer 160. In addition, the substrate 110 comprises a channel region 190 disposed between the first gate electrode 120, the second gate electrode 122, the source region 130 and the drain region 140.

In the semiconductor device 100, the substrate 110 can be undoped silicon substrate or lightly doped N/P type silicon substrate; the first and second gate electrode 120, 122 can be formed by metal (copper for instance); the dielectric layer 170 can be formed by general dielectric material, for example silicon oxide, silicon nitride, nitrogen silicon oxide or any combination of the aforementioned materials; the metal layer 160 is copper; when the semiconductor device 100 is an N-type FET, the source region 130 and the drain region 140 can use N-type doping region formed by the implantation process of N-type dopant; and when the semiconductor device 100 is P-type FET, the source region 130 and the drain region 140 can use P-type doping region formed by the implantation process of P-type dopant. Persons who skilled person in the art should understand the materials of the substrate 110, the first gate electrode 120, the second gate electrode 122, the source region 130 and the drain region 140 in FIG. 1 are not limited in the aforementioned materials but changeable with different process.

The first and second gate electrode 120, 122 are manufactured by through-silicon via (TSV) in this embodiment. Specifically, the substrate 110 is etched for two pilot holes by TSV then coated by the oxide film 150. Then the pilot holes are filled with the gate material (copper for instance) to get the first and second gate electrode 120, 122 in FIG. 1. In addition, the deeper depth of the first and second gate electrode 120, 122 are, the thicker the oxide film is. Otherwise, if the depth of the first and second gate electrode 120, 122 are shallow, it only needs to manufacture a thin oxide film 150. If the semiconductor device 100 needs a better channel control instead of a high voltage device, engineers can design the first and second gate electrode 120, 122 with shallow depth and thin oxide film 150 to acquire a better driving ability and channel control. On the other hand, if semiconductor device 100 needs large size or is a high voltage device, the first and second gate electrode 120, 122 may be designed with deeper depth and thick oxide film 150 to support higher voltage.

When the semiconductor device 100 receives a gate voltage for creating the channel, the channel region 190 will create a channel in response to the gate voltage received by the first and second gate electrode 120, 122 to conduct the source region 130 and the drain region 140. Owing to the first and second gate electrode 120, 122 are embedded in the substrate 110 vertically, there is a large range of the channel, it can greatly increase the current between the source region 130 and the drain region 140. In addition, because of the large volume of the first gate electrode 120 and the second gate electrode 122, its gate resistance is low.

Further, the first and second gate electrode 120, 122 of the semiconductor device 100 are embedded in the substrate 110, therefore the space above the substrate 110 can still be arranged to manufacture other semiconductor devices. For example, the space above the substrate 110 can be arranged to manufacture a FinFET, so can implement a three dimensions circuit in the same die. In addition, owing to the first and second gate electrode 120, 122 are embedded in the substrate 110, it can save the area of the device and can also be applied in those applications that need larger FET.

Figure 2:
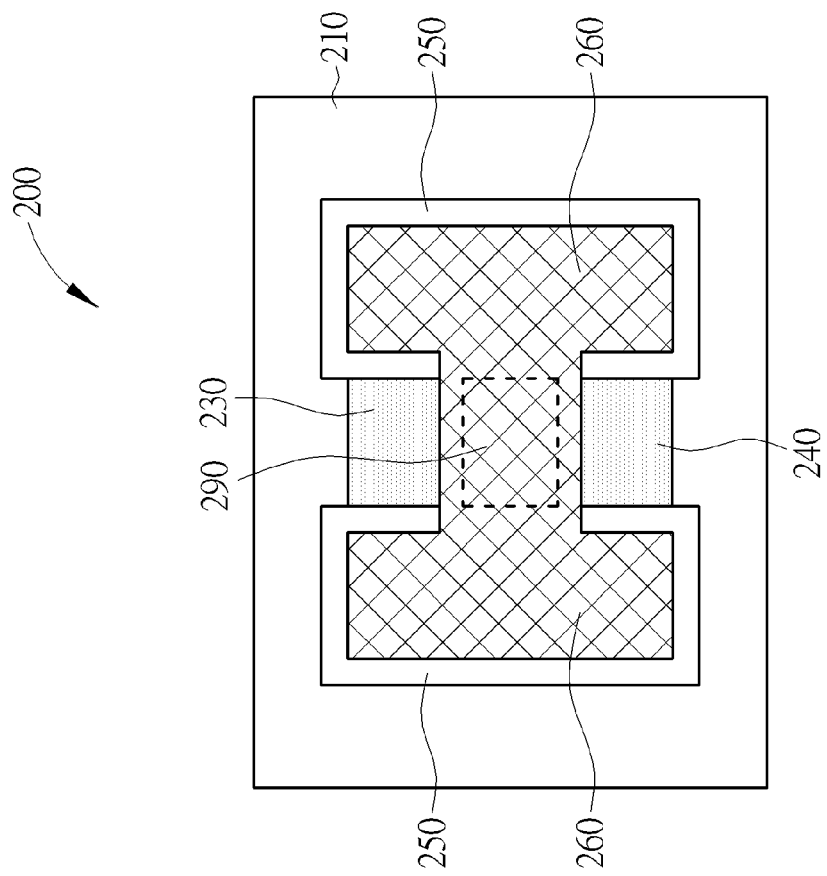
FIG. 2 is a diagram illustrating a side view and a top view of the semiconductor device according to a second embodiment of the present invention.
Figure 2:
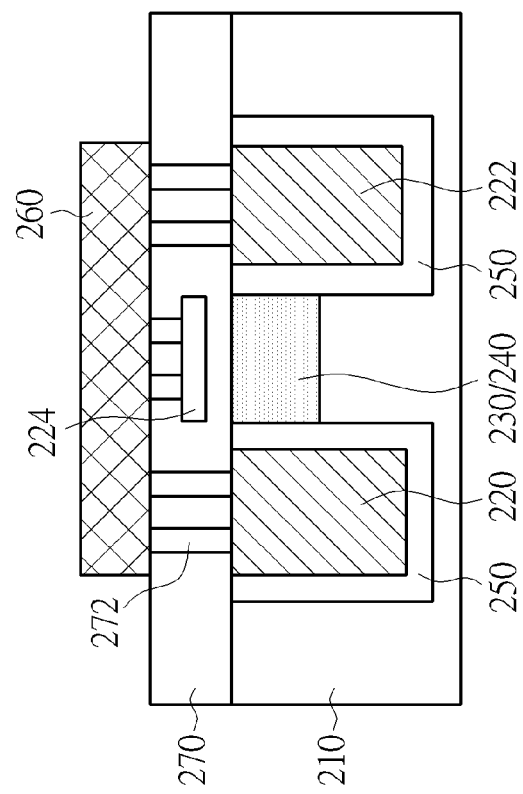

FIG. 2 is a diagram illustrating a side view and a top view of a semiconductor device 200 according to a second embodiment of the present invention, wherein the semiconductor device 200 is a multiple gate FET which comprises a substrate 210, a first gate electrode 220, a second gate electrode 222, a third gate electrode 224, a source region 230 and a drain region 240, wherein the first and second gate electrode 220, 222 are coated in a oxide film 250 and embedded in the substrate 210; the source region 230 and the drain region 240 are formed in the substrate 210, and disposed between the first and second gate electrode 220, 222. In addition, there are a dielectric layer 270 and a metal layer 260 above the substrate 210, the metal layer 260 is electrically connected to the first and second gate electrode 220, 222 through via holes 272, and the first and second gate electrode 220, 222 receives a gate voltage through the metal layer 260. The substrate 210 comprises a channel region 290 disposed under the third gate electrode 224, and between the first gate electrode 220, the second gate electrode 222, the source region 230 and the drain region 240.

In the semiconductor device 200, the substrate 210 can be undoped silicon substrate or lightly doped N/P type silicon substrate; the first and second gate electrode 220, 222 can be formed by metal, the third gate electrode 224 can be formed by polysilicon; the dielectric layer can be formed by general dielectric material, for example silicon oxide, silicon nitride, ILD, FSG, USG or any combination; the metal layer 260 can be copper or other metal(s); when the semiconductor device 200 is an N-type FET, the source region 230 and the drain region 240 can use N-type doping region formed by the implantation process of N-type dopant; and when the semiconductor device 200 is P-type FET, the source region 230 and the drain region 240 can use P-type doping region formed by the implantation process of P-type dopant.

The third gate electrode 224 of the semiconductor device 200 is disposed above the channel region 290, therefore when the semiconductor device 200 receives the gate voltage to induce the channel 290, it will be created in response to the gate voltages received by the first gate electrode 220, the second gate electrode 222 and the third gate electrode 224 to conduct the source region 230 and the drain region 240. Because the first and second gate electrode 220, 222 are embedded in the substrate 210 vertically, and the third gate electrode 224 is disposed above the channel region 290, the semiconductor device 200 creates the channel by the voltages came from three different directions. Therefore, it can greatly increase the current between the source region 230 and the drain region 240.

Similar to the semiconductor device 100, the first and second gate electrode 220, 222 of the semiconductor device 200 are embedded in the substrate 210, therefore the space above the substrate 210 still can be arranged to manufacture other semiconductor devices, such as a FinFET, so can implement a three dimensions circuit in the same die. Due to the first and second gate electrode 220, 222 are embedded in the substrate 210, it can save the area of the device and can also be applied in those applications that need larger FET.

FIG is a diagram illustrating a side view and a top view of a semiconductor device 300 according to a third embodiment of the present invention, wherein the semiconductor device 300 is a multiple gate FET which comprises a substrate 310, a first gate electrode 320, a second gate electrode 322, a source region 330 and a drain region 340, wherein the first and second gate electrode 320, 322 are surrounded by an oxide film 350 and embedded in the substrate 310; the source region 330 and the drain region 340 are formed in the substrate 310, and the source region 330 surrounds one end of the first and second gate electrode 320, 322, the drain region 340 surrounds the other end of the first and second gate electrode 320, 322. In addition, there are a dielectric layer 370 and a metal layer 360 above the substrate 310, the metal layer 360 is electrically connected to the first and second gate electrode 320, 322 through via holes 372, and the first and second gate electrode 320, 322 receive the gate voltage through the metal layer 360. In addition, the semiconductor device 310 comprises three nonadjacent channel regions 390, 392 and 394, wherein the first channel region 390 is disposed between the first gate electrode 320, the second gate electrode 322, the source region 330 and the drain region 340, the second channel region 392 and the first channel region 390 are at opposite sides of the first gate electrode 320, and the third channel region 394 and the first channel region 390 are at opposite sides of the second gate electrode 322.

Figure 3:
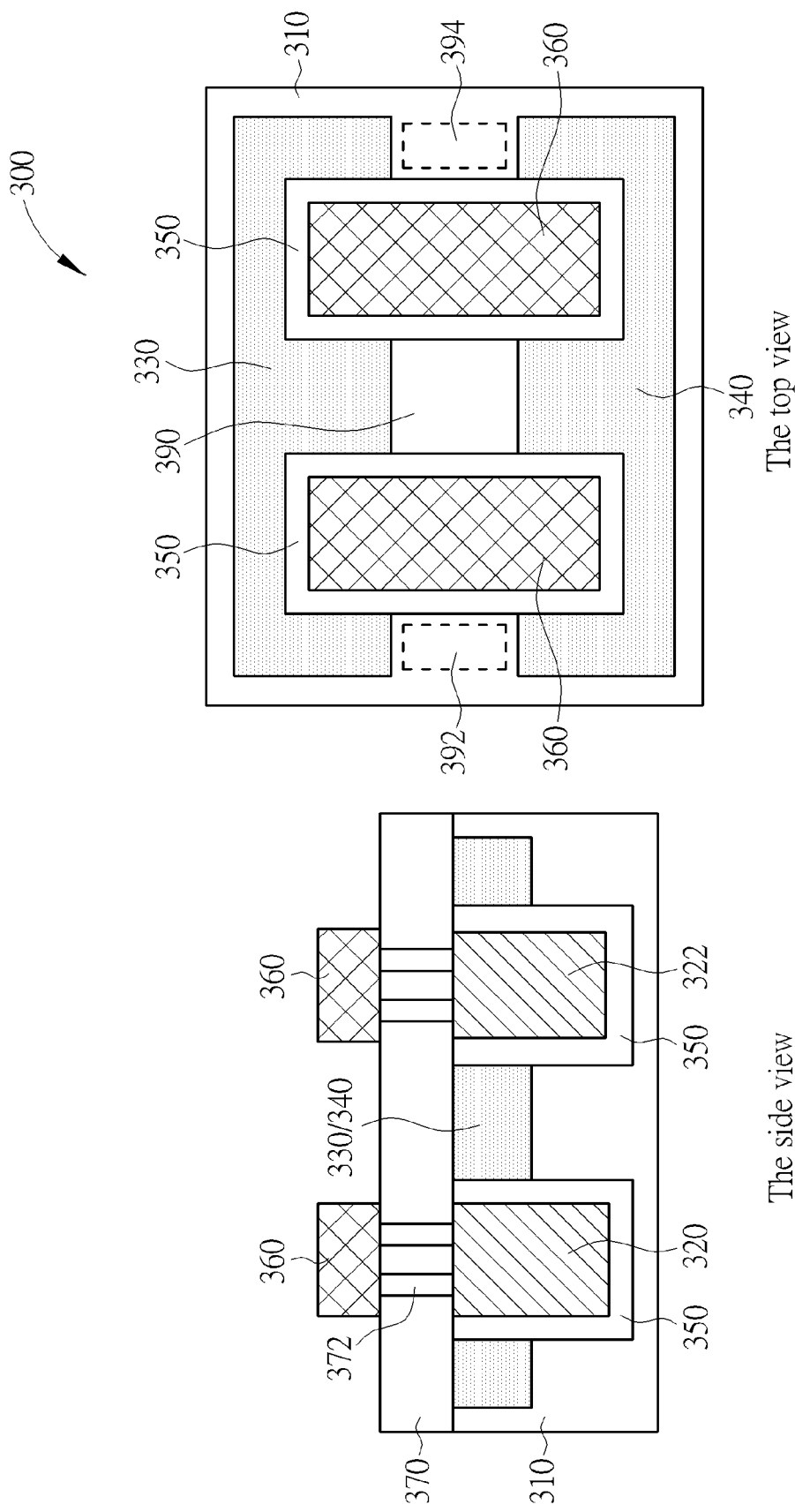
FIG. 3 is a diagram illustrating a side view and a top view of the semiconductor device according to a third embodiment of the present invention.

Different from FIG. 1, the source region 330 and the drain region 340 of the semiconductor device 300 in FIG. 3 are bigger, and the source region 330 and the drain region 340 surround two ends of the first and second gate electrode 320, 322 respectively. Therefore, when semiconductor device 300 receives the gate voltage for creating the channel, the channel regions 390, 392 and 394 will create the channels in response to the gate voltage received by the first and second gate electrode 320, 322 to conduct the source region 330 and the drain region 340. Because the first and second gate electrode 320, 322 are embedded in the substrate 310 vertically, and the source region 330 and the drain region 340 are bigger, the current between source and drain will increase.

Similar to the semiconductor device 100 in FIG. 1, the space above the substrate 310 can be arranged to manufacture other semiconductor devices, such as a FinFET, so can implement a three dimensions circuit in the same die. In addition, owing to the first and second gate electrode 320, 322 are embedded in the substrate 310, it can save the area of the device and can also be applied in those applications that need larger FET.

In another embodiment of the present invention, refer to the semiconductor device 200 in FIG. 2, a third gate electrode can be further added above the channel region 390 in the semiconductor device 300, so the semiconductor device 300 can create the channels by the voltage came from three different directions to greatly increase the current between source region and the drain region.

Figure 4:
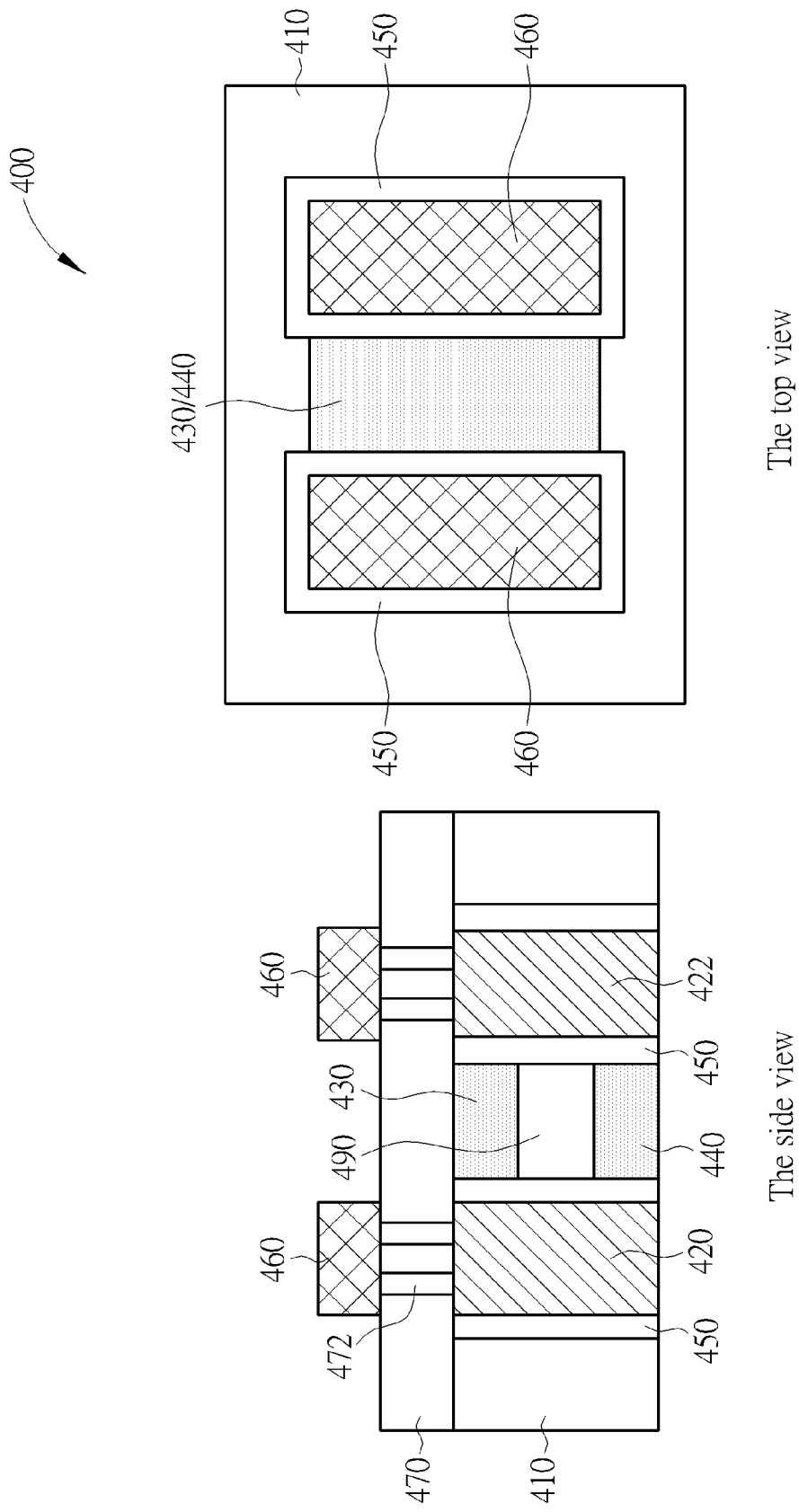
FIG. 4 is a diagram illustrating a side view and a top view of the semiconductor device according to a fourth embodiment of the present invention.

Refer to FIG. 4, which is a diagram illustrating a side view and a top view of a semiconductor device 400 according to a forth embodiment of the present invention, wherein the semiconductor device 400 is a multiple gate FET which comprises a substrate 410, a first gate electrode 420, a second gate electrode 422, a source region 430 and a drain region 440, wherein the first and second gate electrode 420, 422 penetrate substrate 410, and are surrounded by an oxide film 450; the source region 430 and the drain region 440 are formed in the substrate 410, and disposed between the first and second gate electrode 420, 422, wherein the source region 430 and the drain region 440 are disposed at opposite sides of the substrate 410. In addition, there are a dielectric layer 470 and a metal layer 460 above the substrate 410, the metal layer 460 is electrically connected to the first and second gate electrode 420, 422 through via holes 472, and the first and second gate electrode 420, 422 receive the gate voltage through the metal layer 460. In addition, the substrate 410 comprises a channel region 490 disposed between the first gate electrode 420, the second gate electrode 422, the source region 430 and the drain region 440.

In this embodiment, the first and second gate electrode 420, 422 are manufactured by TSV, and owing to the source region 430 and the drain region 440 are at the opposite sides of the substrate 410, therefore, the substrate 410 needs the ion implantation on two sides respectively to create the source region 430 and the drain region 440.

The first and second gate electrode 420, 422 of the semiconductor device 400 are embedded in the substrate 410, therefore the space above the substrate 410 still can be arranged to manufacture other semiconductor devices such as a FinFET, so can implement a three dimensions circuit in the same die. In addition, owing to the first and second gate electrode 420, 422 are embedded in the substrate 410, it can save the area of the device and can also be applied in those applications that need larger FET.

The semiconductor devices shown in FIG. 1 to FIG. 4 are single FET, hence the aforementioned first gate electrodes and second electrodes are all receiving the same gate voltage. In other embodiment, the first and second gate electrode can receive different gate voltages respectively.

Figure 5:
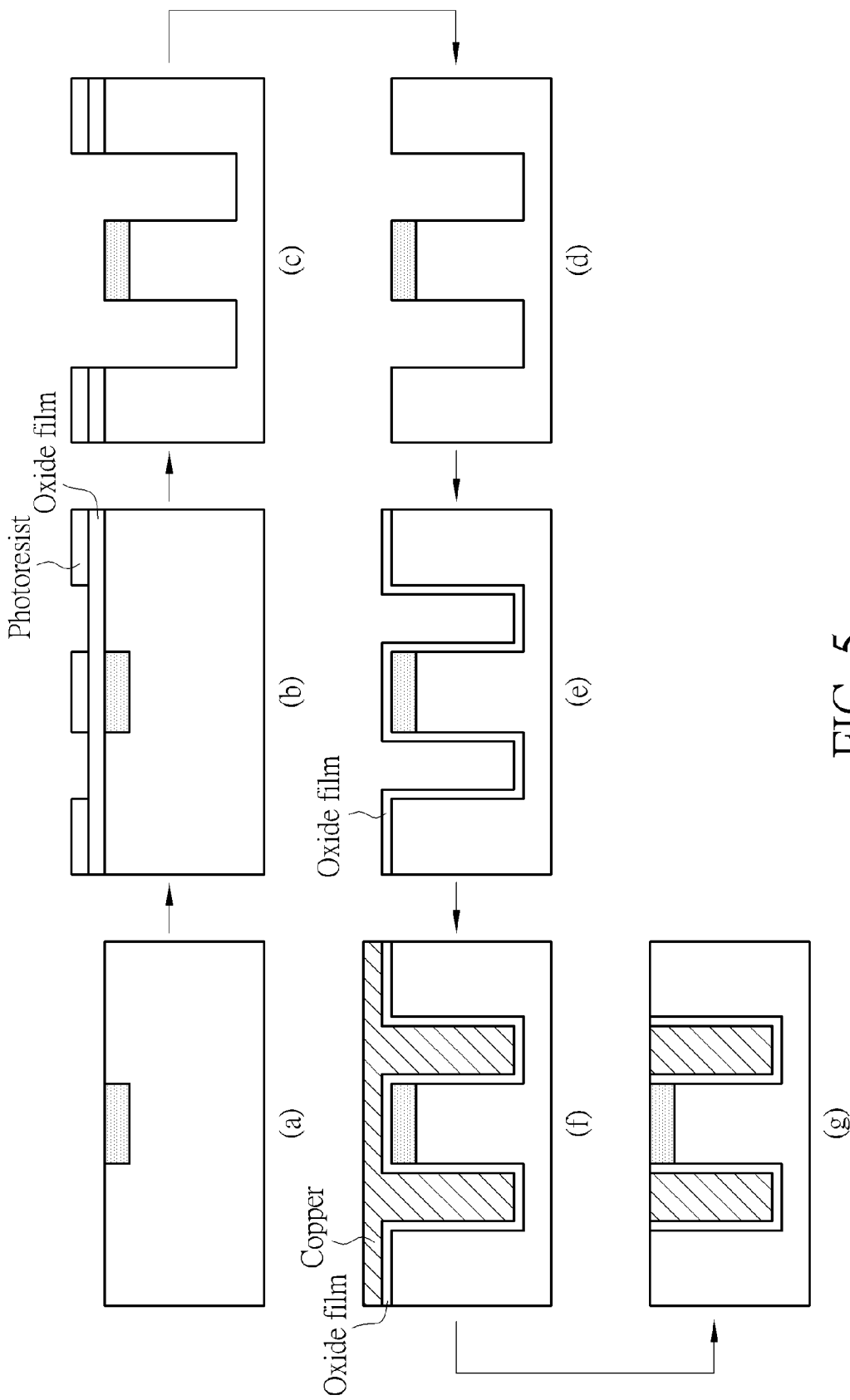
FIG. 5 is a diagram illustrating manufacturing a first gate electrode, a second gate electrode, a source region and a drain region according to an embodiment of the present invention.

FIG. 5 is a diagram illustrating manufacturing the first gate electrode, the second gate electrode, the source region and the drain region of FIG. 1 and FIG. 2 according to an embodiment of the present invention. In step (a), the photoresist is coated on the substrate and conduct ion implantation process to create the source region and the drain region; next, at step (b), an oxide film and photoresist are coated on the substrate for TSV; in step (c), the TSV is conducted to create two pilot holes; in step (d), the photoresist and the oxide film are removed; in step (e), an oxide film is disposed on the substrate; in step (f), a layer of copper is disposed on the substrate; finally, in step (g), a chemical-mechanical planarization (CMP) process is processed to obtain the first gate electrode, the second gate electrode, the source region and the drain region of FIG. 1 and FIG. 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a first gate electrode, embedded in the substrate;
    a second gate electrode, embedded in the substrate;
    a source region, formed in the substrate, at least a portion of the source region is disposed between the first gate electrode and the second gate electrode; and
    a drain region, formed in the substrate, at least a portion of the drain region is disposed between the first gate electrode and the second gate electrode; and
    a channel region, formed in the substrate, and disposed between the first gate electrode and the second gate electrode;
    wherein a third gate electrode is positioned above the channel region of the substrate, and the first gate electrode, the second gate electrode and the third gate electrode are arranged to receive a gate voltage, and an induced channel in the channel region is created or disappeared in response to the gate voltage received by the first gate electrode, the second gate electrode and the third gate electrodes wherein the source region surrounds one end of the first gate electrode and the second gate electrode, the drain region surrounds the other end of the first gate electrode and the second gate electrode, and the semiconductor device further comprises:
    three nonadjacent channel regions, formed in the substrate, wherein a first channel region is disposed between the first gate electrode and the second gate electrode, a second channel region and the first channel region are at opposite sides of the first gate electrode, and a third channel region and the first channel region are at opposite sides of the second gate electrode.

2. The semiconductor device of claim 1, wherein the first gate electrode and the second gate electrode are manufactured by a copper process and the third gate electrode is manufactured by polysilicon.

3. The semiconductor device of claim 1, wherein the first gate electrode, the second gate electrode and the third gate electrode are connected to a metal layer through via holes, respectively, to receive the gate voltage through the metal layer.

4. A multiple gate FET, comprising:
    a substrate;
    a first gate electrode, embedded in the substrate;
    a second gate electrode, embedded in the substrate;
    a source region, formed in the substrate, at least a portion of the source region is disposed between the first gate electrode and the second gate electrode; and
    a drain region, formed in the substrate, at least a portion of the drain region is disposed between the first gate electrode and the second gate electrode; and
    a channel region, formed in the substrate, and disposed between the first gate electrode and the second gate electrode;
    wherein a third gate electrode is positioned above the channel region of the substrate, and the first gate electrode, the second gate electrode and the third gate electrode are arranged to receive a gate voltage, and an induced channel in the channel region is created or disappeared in response to the gate voltage received by the first gate electrode, the second gate electrode and the third gate electrodes wherein the source region surrounds one end of the first gate electrode and the second gate electrode, the drain region surrounds the other end of the first gate electrode and the second gate electrode, and the multiple gate FET further comprises:
    three nonadjacent channel regions, formed in the substrate, wherein a first channel region is disposed between the first gate electrode and the second gate electrode, a second channel region and the first channel region are at opposite sides of the first gate electrode, and a third channel region and the first channel region are at opposite sides of the second gate electrode.

* * * * *